US012761301B2

(12) United States Patent
Choi et al.

(10) Patent No.: US 12,761,301 B2
(45) Date of Patent: Oct. 13, 2026

(54) ANTENNA ASSEMBLY FOR A TOMOGRAPHY SYSTEM

(71) Applicant: Forschungszentrum Jülich GmbH, Jülich (DE)

(72) Inventors: Chang-Hoon Choi, Jülich (DE); Nadim Joni Shah, Jülich (DE); Jörg Felder, Jülich (DE)

(73) Assignee: Forschungszentrum Jülich GmbH (DE)

( * ) Notice: Subject to any disclaimer, the term of this patent is extended or adjusted under 35 U.S.C. 154(b) by 326 days.

(21) Appl. No.: 18/444,963

(22) Filed: Feb. 19, 2024

(65) Prior Publication Data

US 2024/0288521 A1 Aug. 29, 2024

(30) Foreign Application Priority Data

Feb. 23, 2023 (DE) ........................ 102023201650.8

(51) Int. Cl.
*G01R 33/48* (2006.01)
*G01R 33/34* (2006.01)

(52) U.S. Cl.
CPC ..... *G01R 33/481* (2013.01); *G01R 33/34038* (2013.01)

(58) Field of Classification Search
CPC . G01R 33/34038; G01R 33/481; H01Q 21/28
See application file for complete search history.

(56) References Cited

U.S. PATENT DOCUMENTS 2,124,424 A * 7/1938 Leeds ........................ H01P 5/02 343/859
2015/0022420 A1* 1/2015 Lu .......................... H01Q 21/29 343/853
2022/0200148 A1* 6/2022 Kim ....................... H01Q 21/06
2022/0236353 A1* 7/2022 Choi .................... H01Q 21/062

FOREIGN PATENT DOCUMENTS

DE 102019003949 A1 12/2020
WO WO-2020244689 A1 * 12/2020 ........... H01Q 21/062

OTHER PUBLICATIONS

WO 2020/244689 and translation (Year: 2020).*
Choi et al. A Novel J-Shape Antenna Array for Simultaneous MR-PET or MR-SPECT Imaging (Year: 2022).*
5.4 Elektromagnetische Wellen, Jun. 27, 2001, 14 pages.

* cited by examiner

*Primary Examiner* — Steven L Yeninas
(74) *Attorney, Agent, or Firm* — Barnes & Thornburg

(57) ABSTRACT

The present disclosure relates to an antenna assembly for an imaging method, a use of an antenna assembly and a tomography system, in particular for MRI or simultaneous MR-PET/-SPECT. An antenna assembly for an imaging method comprises at least two antennas, wherein each of the two antennas is designed as a J-pole antenna with a radiation section and a feed section. The radiation sections of the two antennas are arranged crossing each other. In this way, effective decoupling of the antennas is achieved by simple means.

20 Claims, 4 Drawing Sheets

ANTENNA ASSEMBLY FOR A TOMOGRAPHY SYSTEM

PRIORITY CLAIM

Figure 1:
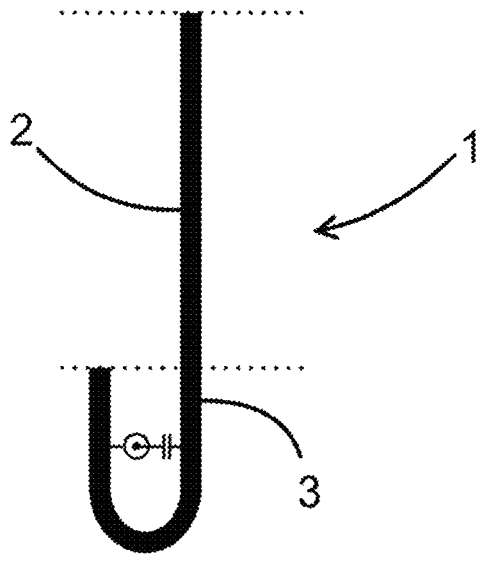

This application claims priority to German Application 102023201650.8, filed Feb. 23, 2023, which application is hereby incorporated in its entirety herein.

FIELD OF THE DISCLOSURE

The present disclosure relates to an antenna assembly for an imaging method, a use of an antenna assembly and a tomography system, in particular for MRI or simultaneous MR-PET/-SPECT.

BACKGROUND

Magnetic resonance imaging (MRI) is a non-invasive imaging method for examining parts of the body, with which high-resolution sectional images of the body can be generated for medical diagnostics. It is based on the resonant excitation of certain atomic nuclei included in the body or supplied to the body by means of strong magnetic fields and alternating magnetic fields in the radio frequency range (nuclear magnetic resonance), which cause the induction of an electrical signal in a receiving antenna. In this way, high-resolution images can be generated.

To perform MRI, radio-frequency antennas—also known as coils in MRI—are used, which are positioned on or around the body or body part to be examined. The arrangement close to the body is particularly the case with ultra-high field MRI (magnetic flux density≥7T) in order to enable a greater penetration depth and generate a symmetrical B1 field pattern. Antenna assemblies with multiple antennas, also known as multichannel antennas or multichannel (antenna) arrays, are used to generate a more homogeneous or spatially extended magnetic field, increase coverage and/or accelerate image acquisition. An antenna assembly can also be used to optimally cover certain parts of the body. An antenna assembly allows the arrangement of a number and possibly shape and/or size of antennas adapted to the respective case, in other words it can be provided as a personalized/dedicated antenna assembly.

Due to the mutual coupling of the antennas in an antenna assembly, interference occurs between the antennas of an antenna assembly as a result of mutual coupling. This is due to electromagnetic interaction between the individual antennas. This leads to a change in the radiation pattern and the input impedance. Additional modes in the frequency spectrum are the result. In addition, the efficiency of power transmission and the ability to improve homogeneity by B1 shimming or with the parallel transmission method are reduced. The coupling of two antennas decreases with increasing distance and angle. This limits the number of antennas per area and/or volume and therefore the achievable resolution (via the achievable SNR) of the imaging method. Substantial effects of coupling are an increased power requirement and a reduction in the coding capacity, which is caused by a reduction in the different field distributions of the individual antennas.

Various methods are known for decoupling, such as partial overlapping, inductive decoupling, capacitive decoupling, magnetic wall decoupling, self-decoupling, induced current compensation or elimination (ICE) or a filter network between the antennas. However, these are usually technically complex, have considerable disadvantages and/or are not suitable for all relevant imaging methods. A J-pole antenna is described in WO 2020 244 689 A1.

SUMMARY

The present disclosure provides an improved antenna assembly, use and an improved tomography system.

An antenna assembly for an imaging method is described herein. The antenna assembly comprises at least two antennas. Each of the two antennas is configured as a J-pole antenna with a radiation section and a feed section. The radiation sections of the two antennas are arranged crossing each other.

An effective electromagnetic decoupling of the two antennas from each other is achieved by the crossing (intersecting) arrangement of the radiation sections. More precisely, the coupling factor is improved (reduced). This allows the image quality to be improved. In addition, more channels, i.e., more antennas, can be arranged per area and/or volume, which improves the power of parallel transmission and thus also the uniformity or homogeneity of the B1 field and increases the signal-to-noise ratio. This further improves the quality and informative value of the image. If a pair of two intersecting antennas is used instead of one antenna of a conventional antenna assembly, the number of antennas can be doubled, for example.

The radiation sections of the two antennas are arranged crossing each other if the radiation sections cross each other (form a cross) in at least one viewing direction. The radiation sections form an angle to each other that is not equal to zero. If the angle is 90°, the maximum decoupling is achieved. In this case, the resulting fields, or more precisely the B1 field directions of the antennas, are perpendicular to each other so that there is no or only minimal mutual interference or coupling. If the angle is 0, on the other hand, there is no decoupling. Therefore, angles approaching 90° are generally desirable.

A particularly high B1 field is achieved in the area of the crossing point due to the presence of two closely adjacent antennas. The crossing point can therefore be selected so that it is located in the target area where a particularly high resolution or a particularly high penetration depth is required. This is where particularly good decoupling takes place and high efficiency can be achieved.

The antenna is a transmitting and/or receiving device for an imaging method. It can be a pure transmitting antenna (transmit-only antenna). In MRI, for example, the antenna is used to generate or transmit radio-frequency (RF) excitation pulses, in particular a radio-frequency alternating magnetic field, and/or to receive or detect magnetic resonance signals, in particular by detecting an electrical voltage induced in the antenna. In particular, the antenna is a radio-frequency antenna that operates at a frequency in the radio wave range or radio frequency range, in particular in the MHz range, and/or is designed for such a range. Future applications could also operate in the GHz range. It can therefore generate and/or detect a radio-frequency field. It can also be referred to as a radio frequency or RF antenna.

A J-pole antenna is a J-shaped antenna with an essentially straight radiation section and a curved, for example U-shaped feed section. The radiation section is configured in particular for transmitting and/or receiving electromagnetic radiation. In particular, the feed section is configured to feed the radiation section. The radiation section and feed section are electrically connected to each other. In particular, the radiation section merges seamlessly into one leg of the U-shaped feed section.

A J-pole antenna can also be referred to as a dipole antenna element. Such an antenna is described in detail in the publication WO 2020 244 689 A1. A J-pole antenna is designed in particular in such a way that it has a fold at one end, which consists of a bend, a bent area and the projection of the bent area onto the length of the J-pole antenna. One leg is longer than the other leg so that a characteristic J-shape is formed. In particular, the two legs are arranged at least essentially parallel to each other. In particular, the bend is realized as a curve. Typically, the longer leg is the radiation section and the bent area or the shorter leg is the feed section. The antenna is therefore typically an end-fed antenna. In particular, the feed section is configured such that it enables the connection of at least one further component, in particular for feeding the antenna. In particular, the radiation section has no connections.

The length of the radiation section is preferably $$\frac{\lambda}{2}.$$

The length of the radiation section means the length of the longer leg from its outermost point to the point at which the projection of the bent area begins. The length of the feed section is preferably $$\frac{\lambda}{4}.$$

The length of the feed section means the length of the shorter leg from the point at which the projection of the bent area begins to the outermost point of the bend. Typically, the lengths are measured along the same straight line. Depending on the desired frequency and target object, the lengths can be adjusted, shortened or extended using various methods.

In particular, a maximum distance between the two crossed antennas is less than the mean extension of the antennas in the direction of the longest extension of the respective antenna. The mean value of the lengths of the two antennas is therefore formed and compared with the distance between the antennas. Preferably, the maximum distance is less than 50% and particularly preferably less than 20% of the mean extension. In one configuration, the antennas and/or the radiation sections are arranged directly adjacent to each other. Thus, the two crossed antennas are arranged close to each other.

In one configuration, in at least one antenna, the leg of the feed section adjoining the radiation section is arranged on the same straight line as the radiation section. In other words, the radiation section and the feed section merge in a straight line. In an alternative or supplementary configuration, in at least one antenna, the leg of the feed section adjoining the radiation section is arranged at an angle to the radiation section. In other words, there is a kink and/or a bend between the radiation section and the feed section. This can also be referred to as an antenna with an inclined feed section.

The imaging method is typically a diagnostic and/or medical method. In particular, it is used to take images of a body or part of a body of a living being, for example a human being, from which information about a state of health of the living being can be derived.

In one embodiment, the antenna assembly is an antenna assembly for magnetic resonance imaging (MRI), ultra-high field MRI, MR positron emission tomography (MR-PET), MR single proton emission computed tomography (MR-SPECT), MR-Linac (linear accelerator combined with a magnetic resonance tomograph) and/or MR-guided ultrasound. In one configuration, the antenna assembly is an antenna assembly for MRI or ultra-high field MRI. This means that the antennas of the antenna assembly are suitable for performing MRI or ultra-high field MRI and/or for use in an MRI system. In one configuration, the antenna assembly is an antenna assembly for MR-PET and/or MR-SPECT. In one configuration, the antenna assembly is an antenna assembly for a combination of two or more of said methods.

PET and SPECT are methods in which radioactive tracers are used to visualize certain metabolic processes and/or molecular pathways. In this way, insights into physiological and metabolic processes can be obtained with a high degree of specificity and sensitivity. According to the present disclosure, the antenna assembly can be used for a combination of these methods with MR.

In particular for MRI applications, the antenna assembly may comprise at least one pair of crossed antennas and additionally one or more single antennas, for example J-pole antennas. In areas where a high density of antennas is required, this can thus be specifically achieved by decoupling. Alternatively or additionally, the antenna assembly can have one or more conventional antennas.

In one embodiment, the antenna assembly is an antenna assembly for simultaneous MR-PET/-SPECT. Simultaneous MR-PET/-SPECT allows to simultaneously perform magnetic resonance imaging and PET/-SPECT. Since the J-pole antenna can function as an MRI antenna and can be configured such that it does not have any highly attenuating materials, such as high-density materials, a particularly low attenuation of only around 15% is achieved for PET/-SPECT. At the same time, a high signal-to-noise ratio in the order of conventional dipole antennas can be achieved with MRI. The decoupling now achieved can further increase B1 homogeneity and image quality.

Previous decoupling methods cannot be used with PET/-SPECT as they comprise the use of highly attenuating and scattering materials, such as capacitors or coaxial cables, at unevenly distributed points in the PET/-SPECT field of view (FOV). This causes severe artifacts and reduces the sensitivity of the PET/-SPECT. In contrast, the decoupling according to the present disclosure by means of crossed radiation sections of the antennas is suitable for PET/-SPECT due to the absence of strongly attenuating and/or scattering materials in the FOV.

In one embodiment, the radiation sections of the two antennas form an angle $\alpha$ between each other. The angle $\alpha$ is ≥30°, in particular ≥45° and/or 90° or less than 90°. In one configuration, the angle $\alpha$ is ≥60°, in particular $\alpha \geq 70°$ and preferably $\alpha \geq 80°$. The angle $\alpha$ is the smaller angle measured between the radiation sections of the two antennas. This means that $\alpha$ is generally less than or equal to 90°. For geometric reasons and/or depending on the specific application, angles of 90° or close to 90° cannot always be realized. Even at 45° or 60°, however, there is still sufficient decoupling. Depending on the application, smaller angles are therefore also possible, as these still lead to an improved decoupling.

In one embodiment, the two antennas are arranged in a common plane. In particular, the radiation section and the feed section of an antenna together define a plane. If this is the case, the antenna is arranged in a plane. The antenna extends mainly in the plane. If the radiation section is linear, the plane is defined or spanned by the feed section. If the feed section is U-shaped, both legs of the "U" lie in the plane. The extension of the antenna perpendicular to the plane is only small, for example less than 10% of the maximum extension of the antenna in the plane. The extension of the antenna outside the plane may be limited to the diameter or the thickness of the antenna body, for example the feed section and/or the radiation section.

In this embodiment, the two antennas are arranged in the same plane. In this way, effective decoupling can be achieved. A planar antenna assembly may be provided, in which one or more pairs of respectively crossed antennas are arranged in a common plane. A spatial antenna assembly may be provided in which at least one pair of crossed antennas is arranged rotated relative to at least one further pair of crossed antennas.

In one embodiment, the antenna assembly has several pairs of two respective antennas arranged crossing each other. In particular, each antenna is arranged crossing only one other antenna. In particular, each antenna therefore only crosses one other antenna. The antennas are therefore in particular arranged in pairs. In this way, maximum decoupling is achieved.

In one embodiment, each pair of antennas is arranged in a plane. The planes of two adjacent pairs of antennas form an angle $\beta$ between each other. In particular, the following applies: $\beta=0°$ or $0°<\beta\leq 90°$. If the angle between the planes is 0°, the planes are arranged parallel to each other. The pairs of antennas can be arranged in the same plane. If the angle is between 0° and 90°, the planes are rotated relative to each other. This can be the case, for example, if the antenna assembly is designed as a hollow body in order to arrange a body or body part in it. In the case of a cylindrical antenna assembly, the rotation may typically have been performed around the central axis of the cylinder. If the angle between the planes of two adjacent antennas is 30°, the circumference of the hollow body can be formed with 12 antennas. If the angle is 60°, only 6 antennas are required. The hollow body can then be correspondingly smaller.

In one embodiment, the radiation section of each of the two antennas is produced from a material essentially transparent to PET and/or SPECT, for example copper or aluminum. Materials essentially transparent to PET and/or SPECT bring low to negligible attenuation and scattering in PET and/or SPECT. In particular, the material essentially transparent to PET and/or SPECT is a metal with a low atomic number. Copper and aluminum are particularly suitable materials for the radiation section. In this way, the antenna assembly can be used as described in tomography systems for simultaneous MR-PET/-SPECT.

In one embodiment, the antenna assembly has 4 or more antennas, preferably 6 or more antennas, and/or 32 or fewer antennas, in particular 20 or fewer antennas, in one configuration 16 or fewer antennas. In antenna assemblies for examining the human head, for example, 6 to 8 antennas can be used. In antenna assemblies for examining the entire human body, for example, 16 to 32 antennas can be used. Such a large number is only possible using the decoupling assembly according to the present disclosure.

All antennas of the antenna assembly can be arranged crosswise in pairs, i.e., each antenna can be arranged crosswise with another antenna. In this case, there is no antenna that is not decoupled in accordance with the present disclosure. In this way, maximum decoupling is achieved overall.

In one embodiment, the antennas of the antenna assembly define a hollow body in which a body or a body part can be arranged. The antennas are arranged around the hollow body. In particular, the radiation parts of the antennas are arranged around the hollow body and/or define the hollow body. In this way, a human or animal body or a part thereof can be accommodated in the hollow body and irradiated there.

In one embodiment, the hollow body has a circular cylindrical basic shape. In this case, the antennas can, for example, be arranged in a regular polygon, such as a regular hexagon, octagon or dodecagon, when viewed along the central axis of the basic shape. Basic shape means that parts of the hollow body or the antenna assembly can deviate from the circular cylindrical shape. The actual shape of the hollow body does not have to be an exact circular cylinder.

In one embodiment, the antenna assembly has a radiation part and a feed part adjacent to the radiation part. The radiation sections of the antennas are arranged in the radiation part. The feed sections of the antennas are arranged in the feed part.

In other words, the entire antenna assembly is divided into two separate parts, a radiation part and a feed part. The feed part typically comprises all feed sections, so that there are no feed sections in the radiation part. All feed sections are then arranged in the feed part. The radiation part can therefore be arranged in the measuring range of the tomography system.

In one embodiment, the antenna assembly comprises at least two adjacent antennas, which are designed as J-pole antennas with a radiation section and a feed section. The at least two antennas are arranged alternately at a first angle and a second angle different from the first angle in relation to a reference surface. The reference surface can be planar or curved, for example cylindrical. The antennas can, for example, be arranged alternately vertically and horizontally. In the case of a circular-cylindrical reference surface, for example, the antennas can be arranged alternately radially and tangentially. The first angle and the second angle can have a difference of 90°. A first antenna of the two antennas can be aligned essentially along the reference surface and a second antenna of the two antennas can be aligned essentially perpendicular to the reference surface. The at least two antennas can be arranged in such a way that the two antennas form an angle $\gamma$ between each other, wherein $\gamma$ is between 25° and 90°, in particular: $\gamma\geq 45°$, preferably $\gamma\geq 60°$.

An effective electromagnetic decoupling of the two antennas from each other is also achieved by the alternating angular arrangement of the antennas. Two different types of decoupling can therefore be combined with each other. For example, there may be pairs of antennas that are arranged crossing each other and other pairs of antennas that are arranged alternately at an angle in relation to a reference surface. Alternatively or additionally, at least one pair of antennas arranged crossing each other can be arranged alternately with a further antenna or a further pair of antennas arranged crossing each other at an angle in relation to a reference surface.

A further aspect of the present disclosure is the use of an antenna assembly in a tomography system, in particular for MRI or simultaneous MR-PET/-SPECT. In particular, the antenna assembly is arranged such that the feed sections are located outside a measuring range of the tomography system. All features, embodiments and advantages of the antenna assembly described above also apply to the use and vice versa.

A further aspect of the present disclosure is a tomography system, in particular for MRI or simultaneous MR-PET/-SPECT. The tomography system comprises an antenna assembly. In particular, the antenna assembly is arranged such that the feed sections are located outside a measuring range of the tomography system.

All features, embodiments and advantages of the antenna assembly described above and of its use also apply to the tomography system and vice versa.

Further exemplary embodiments of the present disclosure are explained in more detail below, also with reference to figures.

BRIEF DESCRIPTIONS OF THE DRAWINGS

Figure 2:
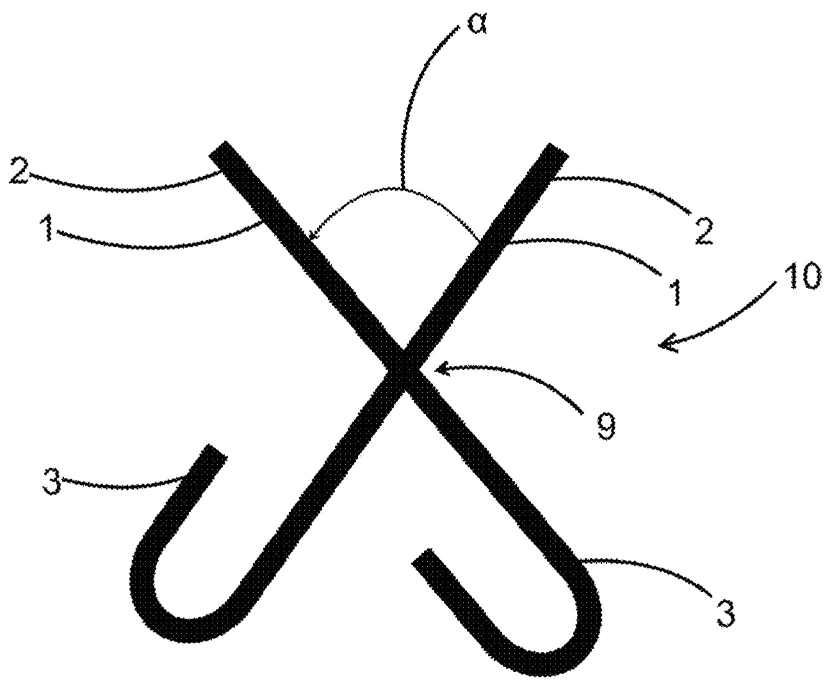
Figure 3:
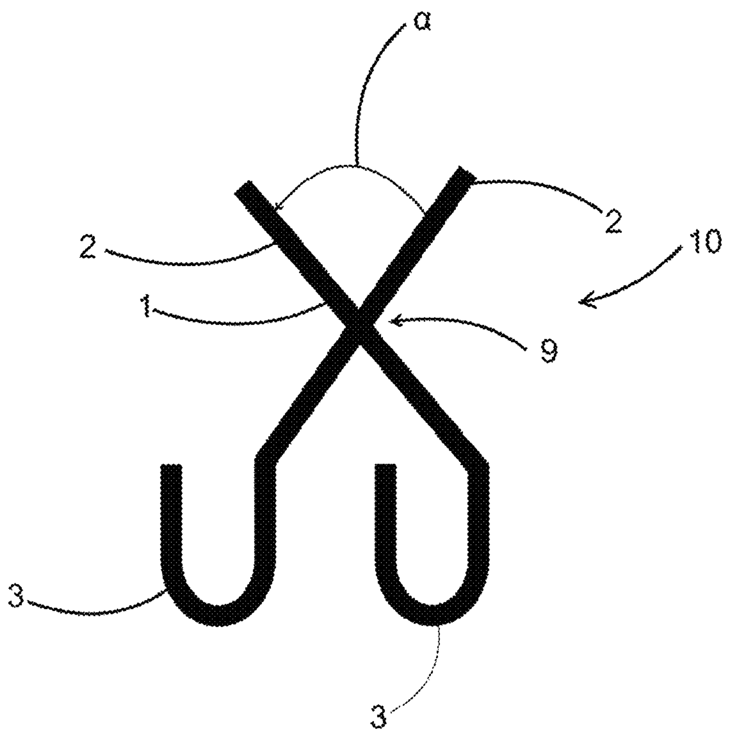
Figure 4:
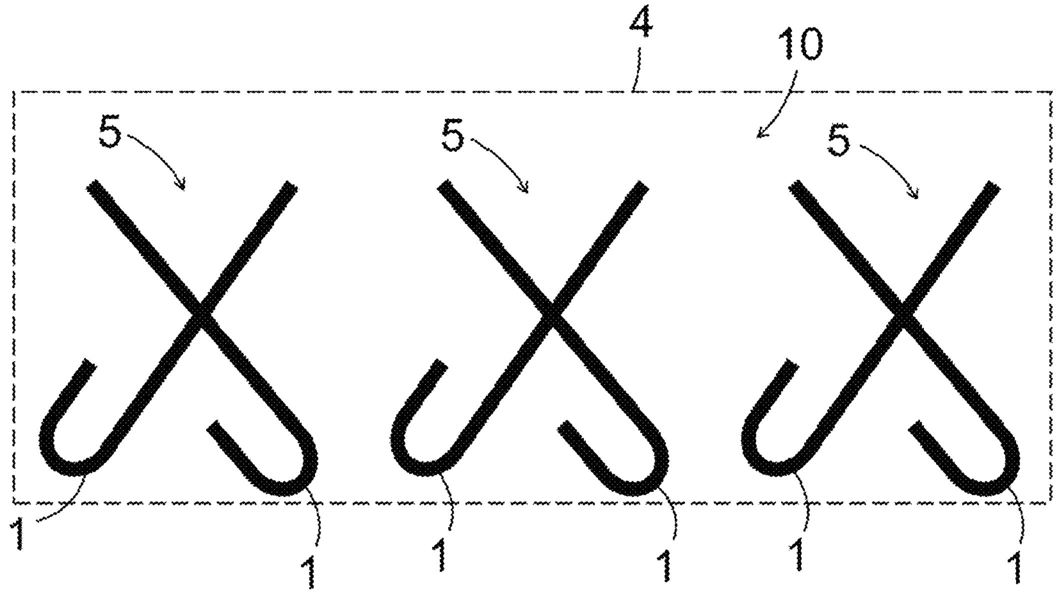
Figure 5:
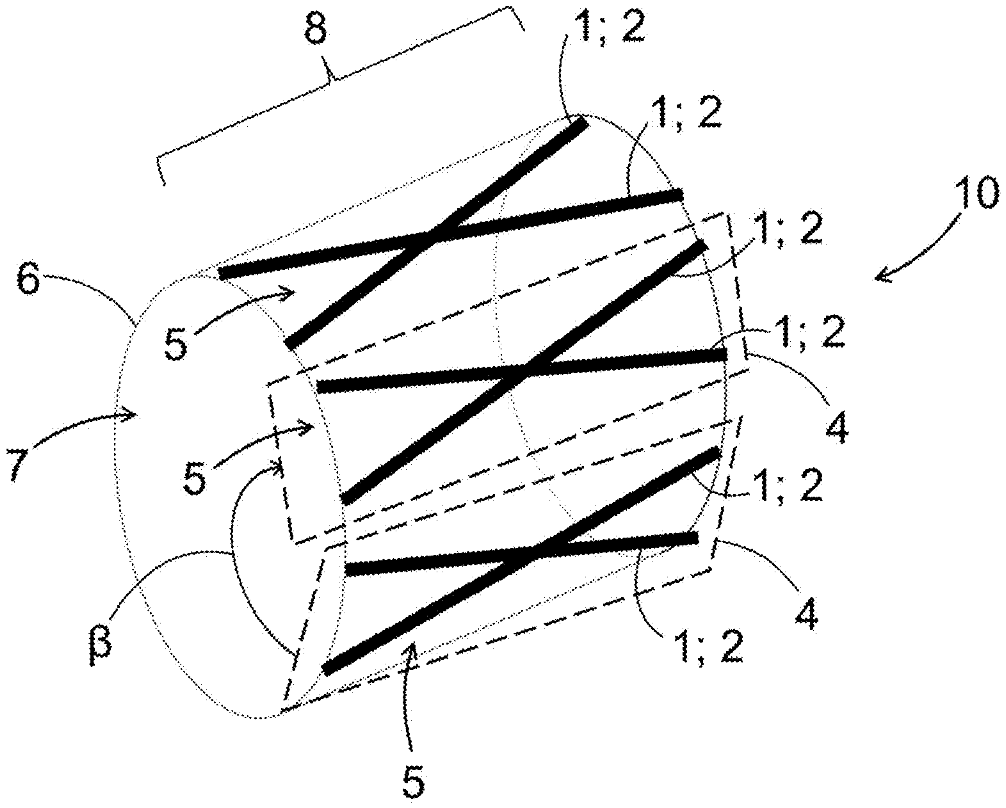
Figure 6:
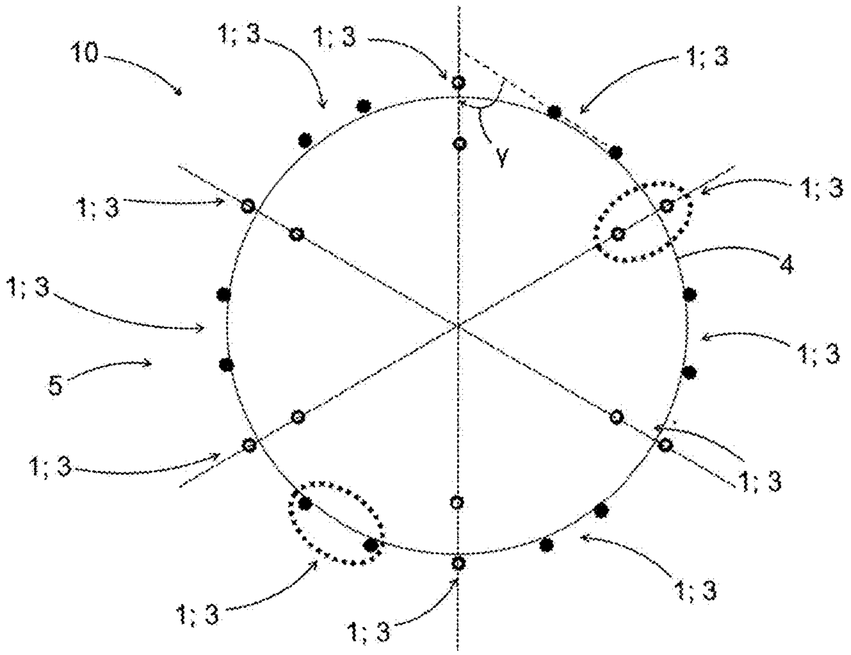
Figure 7A:
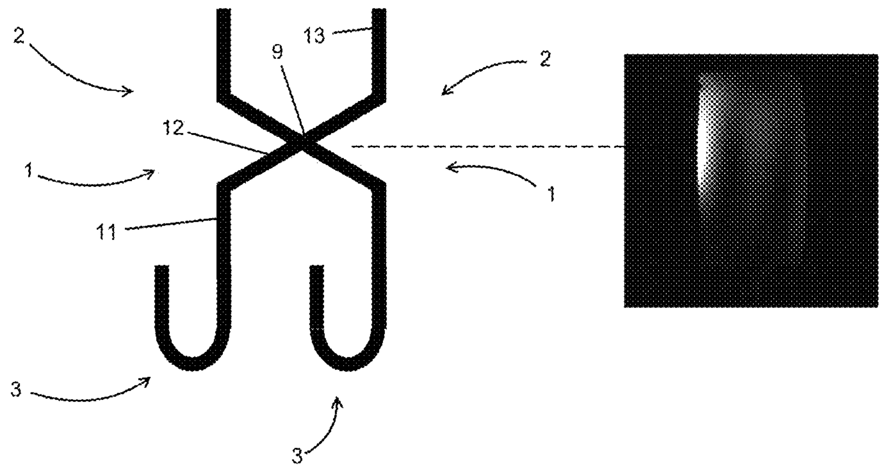
Figure 7B:
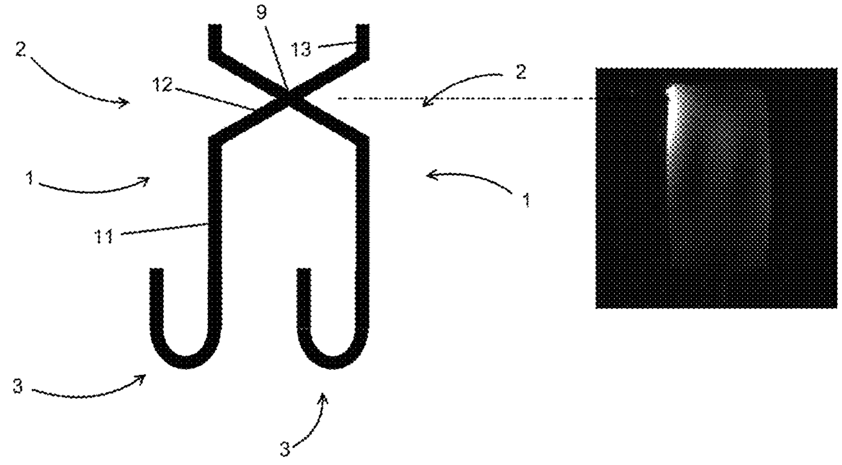
Figure 7C:
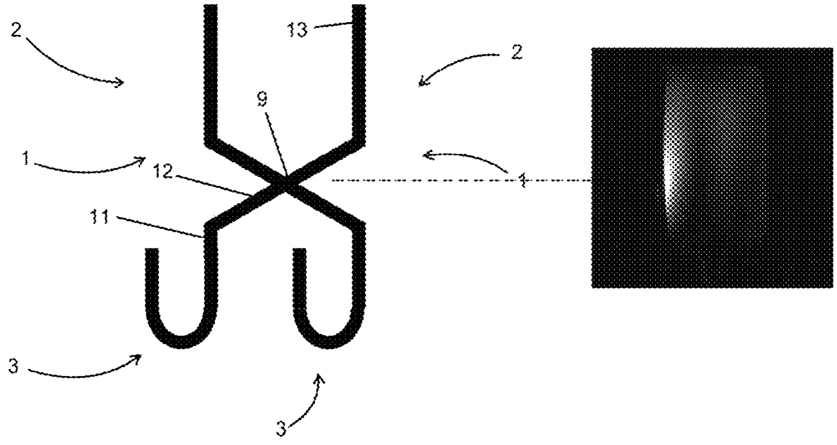

The figures show:

FIG. 1: a schematic representation of a J-pole antenna;

FIG. 2: a schematic representation of an antenna assembly according to the present disclosure;

FIG. 3: a schematic representation of a further embodiment of an antenna assembly according to the present disclosure;

FIG. 4: a schematic representation of a further embodiment of an antenna assembly according to the present disclosure;

FIG. 5: a perspective schematic representation of a further embodiment of an antenna assembly according to the present disclosure;

FIG. 6: a sectional drawing of an antenna assembly in which two antennas are arranged alternately at a first angle and a second angle in relation to a reference surface, FIG. 7A-7C: schematic representations of further embodiments of the antenna assembly according to the present disclosure.

DETAILED DESCRIPTION

FIG. 1 shows an antenna 1 in the shape of a J-pole antenna. This comprises a straight radiation section 2 and an immediately adjacent feed section 3. The feed section 3 is U-shaped. The radiation section 2 merges seamlessly into a leg of the U. This creates the characteristic J-shape of antenna 1.

The radiation section 2 serves for transmitting and receiving or exclusively transmitting electromagnetic signals of an imaging method such as, for example, MRI or simultaneous MR-PET/-SPECT. The feed section 3 is used to feed the antenna 1, or more precisely the radiation section 2.

The cross-section of the antenna 1 is designed in particular so that it does not cause any abrupt changes in the absorption coefficients for y-radiation. For example, the cross-section is circular or elliptical. This can prevent artifacts in PET/-SPECT imaging. The antenna 1 is preferably thin. In the sense of the present disclosure, thin means, for example, a thickness corresponding to 3 to 5 times the penetration depth of the radio frequency field into the antenna.

The two dotted lines mark the upper end of the antenna 1 and the boundary between the radiation section 2 and the feed section 3. The length of the radiation section 2 between the two dotted the U-shape is typically $$\frac{\lambda}{2}.$$

The length of the feed section 3 from the lower dotted line to the lower end of the U-shape is typically $$\frac{\lambda}{4}.$$

This can be adapted as described above.

FIG. 2 shows a first embodiment of an antenna assembly 10 according to the present disclosure. Two J-pole antennas, for example like the one shown in FIG. 1, are arranged here in such a way that the radiation sections 2 of the two antennas 1 cross each other. A crossing point 9 is formed. The two antennas 1 form an angle α of approximately 75° between each other. The angle α is the smaller angle measured between the radiation sections 2 of the two antennas 1. This angle can be determined by the design of the antenna assembly, the research objective and the target object. The angle may be between approximately 0 degrees (worst decoupling; strong coupling, almost parallel radiation sections) and 90 degrees (best decoupling, perpendicular to each other). In this way, a decoupling of the two antennas 1 from each other is achieved, which allows more antennas 1 to be arranged per volume and/or per surface. The imaging method is thus improved, in particular the uniformity and the signal-to-noise ratio are increased.

FIG. 3 shows a further embodiment of an antenna assembly 10 according to the present disclosure. In contrast to the antennas 1 in FIGS. 1 and 2, the antennas 1 in the embodiment shown here have a kink between the respective radiation section 2 and the respective feed section 3. The angle of this kink can be arbitrary. Although the radiation sections 2 form approximately the same angle α between each other as in FIG. 2, the feed sections 3 of the two antennas 1 are arranged in parallel here as an example. In other words, the feed sections 3 have the same orientation. This can, for example, improve accessibility and/or facilitate the connection. Deviating from this, different angles and/or vertical or horizontal alignments can also be achieved.

FIG. 4 shows a further embodiment of an antenna assembly 10 according to the present disclosure. This comprises three pairs 5, each consisting of two antennas 1 arranged crossing each other. Each pair 5 of antennas 1 is shown here as an example as in FIG. 2. It is also possible for one or more pairs 5 to be configured according to FIG. 3. One or more individual antennas 1 can also be designed with a kink according to FIG. 3. Deviating from this, there may also be an odd number of antennas 1, for example one antenna 1 and three pairs 5 and possibly a further antenna 1. This is particularly the case with planar antenna assemblies.

A characteristic feature of the antenna assembly 10 in FIG. 4 is that all pairs 5 and thus all antennas 1 are arranged in a common plane 4. In a viewing direction perpendicular to the plane of the drawing, the antenna assembly 10 is therefore only rod-shaped, wherein the thickness of the rod corresponds to the cross-section of the radiation section 2 and/or the feed section 3.

Due to the arrangement shown, decoupling is also achieved between the first and third antennas 1. This has a similar effect to the decoupling between the first and second antennas 1. Therefore, the distance between the first antenna 1 and the third antenna 1 can be reduced.

FIG. 5 shows a further embodiment of an antenna assembly 10 according to the present disclosure, in which pairs 5 of antennas 1 are arranged crossing each other in such a way that they surround a hollow body 6. The antennas 1 are arranged so that their radiation sections 2 surround the hollow body 6. The hollow body 6 has a circular cylindrical basic shape 7. A body part or a body can be accommodated in the hollow body 6 in order to be examined using the imaging method. The radiation sections 2 of the antennas 1 together form a radiation part 8 of the antenna assembly 10.

For reasons of clarity, only three pairs 5 of antennas 1 are shown. However, a total of six or eight pairs 5 of antennas 1 are typically present here.

For reasons of clarity, the feed sections of the antennas 1 are not shown in FIG. 5. In particular, the feed sections of the antennas 1 together form a feed part, which may be arranged at the left end or at the right end of the radiation part 8 and thus of the hollow body 6 and preferably directly adjoins the radiation part 8. Preferably, the antennas 1 therefore all have the same orientation.

It can be seen that the angle α (not shown here) between the two crosswise arranged radiation sections 2 is smaller than in the previously described configurations. For example, the angle α here is between 25° and 35°, in particular around 30°. In this way, the elongated geometry of the cylinder, which may be used to examine a human head, for example, and at the same time the intersecting arrangement of the radiation sections 2 according to the present disclosure can be realized. In this way, sufficient decoupling of the antennas 1 of the respective pair of antennas 5 is still achieved, which enables the shown significantly denser arrangement of antennas 1 compared to the prior art and in this way improves the imaging method. The angle could also be more than 15°, more than 20° or more than 25°, for example.

Each pair 5 of intersecting antennas 1 is arranged in a plane 4, of which two planes 4 are drawn by way of example. In each case, adjacent planes 4 have an angle β between them, which is 45° in the example shown here. In this example, there are a total of eight pairs 5 of antennas 1, which form a regular octagon with eight angles of 45° when viewed in the longitudinal direction of the hollow body 6.

FIG. 6 shows another antenna assembly 10 for an imaging method with twelve respectively adjacent antennas 1, each of which is designed as a J-pole antenna with a radiation section 2 and a feed section 3. The antennas 1 are arranged alternately at a first angle and a second angle different from the first angle in relation to a reference surface 4. A sectional drawing of an antenna assembly 10, which defines a hollow body 6 and has a circular cylindrical basic shape, is shown in the radial direction. There are twelve antennas 1 evenly distributed around the circumference of the circle. The sectional plane shown runs through the feed part of the antenna assembly 10, so that each antenna 1 can be recognized by its feed section 3, which is represented by two circular conductors. These represent the leg of the "U". The plane of each antenna 1 is spanned by these circular conductors.

The reference surface 4 is the lateral surface of the circle. It is therefore a curved reference surface 4. The antennas 1 are arranged alternately at an angle of 0° and 90° to the reference surface 4. The antennas 1 are therefore alternately aligned along the reference surface 4 (shown as filled circles) and perpendicular to the reference surface 4 (shown as circles with a white core). For clarity, one antenna 1 of each of the two described orientations is circled with a dotted line and thus highlighted. Adjacent antennas 1 have an angle γ between them, which in this case is 60° due to the twelve antennas. In this way, the antennas 1 are decoupled from each other, allowing more antennas 1 to be arranged per volume or per surface. In this way, the imaging method is improved, in particular the resolution is increased. This embodiment can be combined as desired with the intersecting (crossing) arrangement of the antennas 1 according to the present disclosure described above in order to achieve a further improved decoupling.

In particular, the antenna assembly 10 comprises a positioning unit for positioning the antennas 1 in relation to each other and/or to a body to be examined. This can be designed as a holding device for holding the antennas 1 and/or as a fastening unit for mechanically fastening the antennas 1 to one another. The positioning unit can, for example, have the basic circular cylindrical shape 7. The positioning unit may be adapted to the shape and/or size of the body or body part to be examined, here for example the human head.

MRI, PET and SPECT stand as well-established medical imaging modalities used in current routine clinical practice. MRI, predominantly utilizing hydrogen nuclei (1H), is renowned for its capacity to produce high-quality structural and anatomical images. Its strength lies in delivering exceptional soft tissue contrast, making it valuable for visualizing detailed internal structures in the body. Furthermore, MRI is capable of obtaining functional information, allowing for the assessment of various physiological processes alongside anatomical details. This combination of structural and functional data renders MRI a versatile tool in the diagnosis and monitoring of a wide range of medical conditions. PET and SPECT are nuclear medicine imaging techniques which relies on the detection of different radiotracers to generate images that highlight metabolic and biochemical processes within the body. The combined use of MR-PET or MR-SPECT enhances the complementary nature of the information they provide, resulting in a more holistic understanding of both structure and function. This integrated approach strengthens diagnostic capabilities and aids in formulating comprehensive treatment strategies in clinical settings.

An MRI scanner is primarily composed of a magnet to create a strong static magnetic field ($B_0$), a gradient system for spatial encoding, and a radiofrequency (RF) system designed to excite the spins of the subject and receive MR signals. The RF field generated by the RF system, such as RF coil or antenna, is referred to as the $B_1$ field.

For ultra-high field (UHF) MRI applications ($B_0 \geq 7T$), radiating antennas have been implemented as they offer optimal imaging performance at the field strength where uniform excitation throughout the imaging region becomes challenging due to the shortened RF wavelength.

Known decoupling methods are mostly not suitable for all relevant imaging methods, e.g. simultaneously operating MR-PET systems, since any added material and physical components degrades PET performance.

Arranging the number of channels or antennas per area and/or volume improves the functionality and efficiency of parallel transmission and thus the homogeneity of the transmit field and specific absorption rate (SAR) and increases the signal-to-noise ratio (SNR). A more effective B1 field is achieved in the area of the crossing point due to the presence of two closely adjacent antennas. The crossing point can therefore be selected so that it is located in the target area where a particularly high sensitivity or a particularly high penetration depth is required. The crossing point can in principle be freely selected according to the respective requirements. In case of several pairs of antennas, the crossing points may be at the same positions and/or at different positions. The antenna may be a transmit and receive device for an imaging method. The radiation section is configured in particular for transmitting and/or receiving electromagnetic signal. A J-pole antenna can also be referred to as a J-shape antenna element. The length of the radiation section is preferably $$\frac{\lambda}{2}$$

in a free space. The length of the reed section is preferably $$\frac{\lambda}{4}$$

in a free space. Simultaneous MR-PET/-SPECT can also be referred to as simultaneously operating hybrid MR-PET/-SPECT.

In one configuration, the radiation section 2 of at least one antenna 1 is subdivided into two or three sections. In particular, at least one section, two sections or each section runs in an at least substantially straight course. There may be curves or kinks between the individual sections. The crossing point of the radiation sections of the two antennas may be formed by the first sections 11 or the second sections 12 of each of the two antennas crossing each other.

In one configuration, a first section 11 of the radiation section 2 is positioned directly adjacent to the feed section 3. The first section 1 may be a straight extension of one leg of the feed section 3. A second section 12 may be positioned adjoining the first section 11. There may be a curve or kink between the first and second sections 11, 12. A third section 13 may be positioned adjoining the second section 12. There may be a further curve or kink between the second and third sections 12, 13. The first and third sections 11, 13 may be arranged in parallel, in particular along the same axis. The second sections 12 may be arranged crossing each other.

The focusing area, i.e. the area in which the highest B1 sensitivity and efficiency can be achieved, typically corresponds to an area of the crossing point 9 or adjacent to the crossing point 9 of the radiation sections. By varying the crossing point, the focusing area can be varied, as shown in FIGS. 7A to 7C.

In FIG. 7A, the crossing point 9 is arranged substantially in the center of the radiation sections 1. In other words, the first section 11 and the third section 13 are substantially of equal length. A corresponding MR image is shown to the right of the diagram. It can be seen that the brightest region or focusing region which represents the highest SNR is arranged at the same height as the crossing point 9.

In FIG. 7B, the crossing point 9 is located at a higher level. The first section 11 of each radiation section 2 is substantially longer than the third section 13. Thus, the crossing point 9 is located further away from the feed sections 3. The corresponding MR image shows that the focus region is also at a higher position.

To the contrary, FIG. 7C shows an embodiment in which the crossing point 9 and the focus region are arranged on a lower level due to short first sections 11 and long third sections 13.

It can be seen that the focus section can be shifted or positioned according to the requirements by positioning the crossing point at the desired position, for example by varying the lengths of the first sections 11 and third sections 13.

Antennas as shown in FIGS. 7A to 7C can also be used to form arrays, for example as shown in FIG. 5. This enables to optimize and enhance the image quality of the target region, e.g. motor cortex or cerebrum in a human head.

LIST OF REFERENCE SIGNS

Antenna 1
Radiation section 2

Feed section 3
Plane 4
Pair 5
Hollow body 6
Circular-cylindrical basic shape 7
Radiation part 8
Crossing point 9
Antenna assembly 10
Angle α
Angle β
First section 11
Second section 12
Third section 13

The invention claimed is:

1. An antenna assembly for an imaging method, the antenna assembly comprising at least two antennas, each of the two antennas configured as a J-pole antenna with a radiation section and a feed section, wherein the radiation sections of the two antennas are arranged crossing each other, and wherein the antenna assembly is an antenna assembly for magnetic resonance imaging (MRI), ultra-high field MRI, MR positron emission tomography (MR-PET), MR single proton emission computed tomography (MR-SPECT), MR linac and/or MR ultrasound.

2. The antenna assembly of claim 1, wherein the antenna assembly is an antenna assembly for simultaneous MR-PET/-SPECT.

3. The antenna assembly of claim 1, wherein the radiation sections of the two antennas form an angle α between 30° and 90° between one another.

4. The antenna assembly of claim 3, wherein the radiation sections of the two antennas form an angle α between 45° and 90° between one another.

5. The antenna assembly of claim 1, wherein the two antennas are substantially arranged in a common plane.

6. The antenna assembly of claim 5, wherein each pair of antennas is arranged in a plane, wherein the planes of two adjacent pairs of antennas form an angle β between each other, wherein: $\beta=0°$ or $0°<\beta\leq 90°$.

7. The antenna assembly of claim 1, wherein the antenna assembly comprises several pairs of two antennas arranged crossing each other in each case.

8. The antenna assembly of claim 1, wherein the radiation section of each of the two antennas is produced from a material substantially transparent to PET and/or SPECT.

9. The antenna assembly of claim 1, wherein the antenna assembly has between 4 and 32 antennas.

10. The antenna assembly of claim 8, wherein the radiation section of each of the two antennas consists essentially of copper or aluminum.

11. The antenna assembly of claim 9, wherein the antenna assembly has between 6 and 16 antennas.

12. The antenna assembly of claim 1, wherein the antennas of the antenna assembly define a hollow body in which a body or a body part can be arranged.

13. The antenna assembly of claim 12, wherein the hollow body has a circular cylindrical basic shape.

14. The antenna assembly of claim 1, wherein the antenna assembly has a radiation part and a feed part adjacent to the radiation part, wherein the radiation sections of the antennas are arranged in the radiation part and the feed sections of the antennas are arranged in the feed part.

15. The antenna assembly of claim 1, wherein the antenna assembly comprises at least two antennas arranged adjacent to each other, which are designed as J-pole antennas with a radiation section and a feed section, wherein the at least two antennas are arranged alternately at a first angle and a second angle different from the first angle in relation to a reference surface.

16. The antenna assembly of claim 4, wherein the two antennas are substantially arranged in a common plane.

17. The antenna assembly of claim 1, wherein each pair of antennas is arranged in a plane, wherein the planes of two adjacent pairs of antennas form an angle β between each other, wherein: β=0° or 0°<β≤90°.

18. The antenna assembly of claim 1, wherein the antenna assembly has a radiation part and a feed part adjacent to the radiation part, wherein the radiation sections of the antennas are arranged in the radiation part and the feed sections of the antennas are arranged in the feed part.

19. A method of using an antenna assembly in a tomography system, the method comprising providing the antenna assembly having at least two antennas, each of the two antennas configured as a J-pole antenna with a radiation section and a feed section, wherein the radiation sections of the two antennas are arranged crossing each other, and acquiring imaging via MRI or simultaneous MR-PET/-SPECT using the antenna assembly.

20. A tomography system adapted for MRI or simultaneous MR-PET/-SPECT, the system comprising an antenna assembly having at least two antennas, each of the two antennas configured as a J-pole antenna with a radiation section and a feed section, wherein the radiation sections of the two antennas are arranged crossing each other, and wherein the antenna assembly is arranged in particular such that the feed sections are located outside a measuring range of the tomography system.

* * * * *